United States Patent
Chang

(10) Patent No.: US 7,812,668 B2
(45) Date of Patent: Oct. 12, 2010

(54) MULTI-INPUT OPERATIONAL AMPLIFIER AND METHOD FOR REDUCING INPUT OFFSET THEREOF

(75) Inventor: Yung Ching Chang, Hsinchu (TW)

(73) Assignee: Advanced Analog Technology, Inc., Hsinchu (TW)

( * ) Notice: Subject to any disclaimer, the term of this patent is extended or adjusted under 35 U.S.C. 154(b) by 151 days.

(21) Appl. No.: 12/235,925

(22) Filed: Sep. 23, 2008

(65) Prior Publication Data

US 2009/0261904 A1 Oct. 22, 2009

(30) Foreign Application Priority Data

Apr. 21, 2008 (TW) ............................... 97114446 A

(51) Int. Cl.
*H03F 3/45* (2006.01)
(52) U.S. Cl. ...................... 330/69; 330/124 R; 330/288

(58) Field of Classification Search .................... 330/9, 330/69, 124 R, 288
See application file for complete search history.

(56) References Cited

U.S. PATENT DOCUMENTS

| 6,515,542 | B1 * | 2/2003 | Wang et al. ................... 330/69 |
| 7,042,284 | B2 * | 5/2006 | Moons et al. ................. 330/69 |
| 2002/0118063 | A1 * | 8/2002 | Jeanjean et al. .............. 330/69 |

* cited by examiner

*Primary Examiner*—Khanh V Nguyen
(74) *Attorney, Agent, or Firm*—WPAT, P.C.; Anthony King

(57) ABSTRACT

A multi-input operational amplifier comprises two transconductors, two current mirrors, and a current source. Each transconductor generates a current according to a corresponding voltage difference. When the voltage difference is less than or equal to zero, the current is a constant. When the voltage difference exceeds zero, the current is proportional to the voltage difference.

11 Claims, 8 Drawing Sheets

MULTI-INPUT OPERATIONAL AMPLIFIER AND METHOD FOR REDUCING INPUT OFFSET THEREOF

BACKGROUND OF THE INVENTION

1. Field of the Invention

The present invention relates to a circuit design, and more particularly, to a design methodology of a multi-input operational amplifier.

2. Description of the Related Art

A multi-input operational amplifier is commonly seen in meter amplifier fields. Generally, a multi-input operational amplifier includes multiple differential input terminals connected to transconductors, and then connected to a primary amplifier. FIG. 1 shows a structural diagram of a well-known two-input operational amplifier. The first differential input pair 102 and 104 feed separately into non-inverting (+) and inverting (−) ends of the first transconductor 110. The second differential input pair 106 and 108 feed separately into non-inverting (+) and inverting (−) ends of the second transconductor 112. The two transconductors are connected through an adder 114, and then output through a primary amplifier 116. The primary purpose of the operational amplifier with differential input ends is to avoid common mode noise or interference.

However, one input pair of a general multi-input operational amplifier affects the other input pair, and causes an input voltage offset to the other input pair. FIG. 2 shows an input/output curve offset phenomenon of the second input terminal resulting from the level shift of the first input terminal. The curves 22, 24, 26 in FIG. 2 represent, respectively, the relations of the inverting input and output terminals of the second input pair under the conditions where the voltage of the inverting input of the first input pair is equal to that of the non-inverting input terminal, the voltage of the inverting input of the first input pair is slightly smaller than that of the non-inverting input terminal, and the voltage of the inverting input terminal is equal to zero voltage. The difference between the transition point of the curve 22 and that of the curves 24 and 26 represents that the first input terminal affects the second output terminal.

SUMMARY OF THE INVENTION

The present invention proposes a multi-input operational amplifier, which comprises a first transconductor, a second transconductor, a first current mirror, a second current mirror and a current source. The first transconductor is configured to generate a first current in accordance with a voltage of a first input end and a first reference voltage. The first current is a non-zero first constant if the voltage of the first input is smaller than a first voltage, and the first current is proportional to the voltage of the first input end if the voltage of the first input end is between the first input voltage and a second voltage. The second transconductor is configured to generate a second current in accordance with a voltage of a second input end and a second reference voltage. The second current is a non-zero second constant if the voltage of the second input end is smaller than a third voltage, and the second current is proportional to the voltage of the second input end if the voltage of the second input end is between the third voltage and a fourth voltage. The first current mirror is configured to generate a first mirror current in accordance with the first current. The second current mirror is configured to generate a second mirror current in accordance with the second current. The current source is connected to the first current mirror and the second current mirror.

The present invention proposes a method for reducing an input offset of a multi-input operational amplifier, which includes a first input end, a second input end and a current source. The method comprises the steps of: setting a first reference voltage, a second reference voltage, a first voltage, a second voltage, a third voltage and a fourth voltage; if the voltage of the first input end is between the first voltage and the second voltage, a first current positively associating the voltage of the first input end being generated, otherwise the first current being a constant; and if the voltage of the second input end is between the third voltage and the fourth voltage, a second current positively associating the voltage of the second input end being generated, otherwise the second current being a constant.

BRIEF DESCRIPTION OF THE DRAWINGS

The invention will be described according to the appended drawings in which.

PREFERRED EMBODIMENT OF THE PRESENT INVENTION

Figure 1:
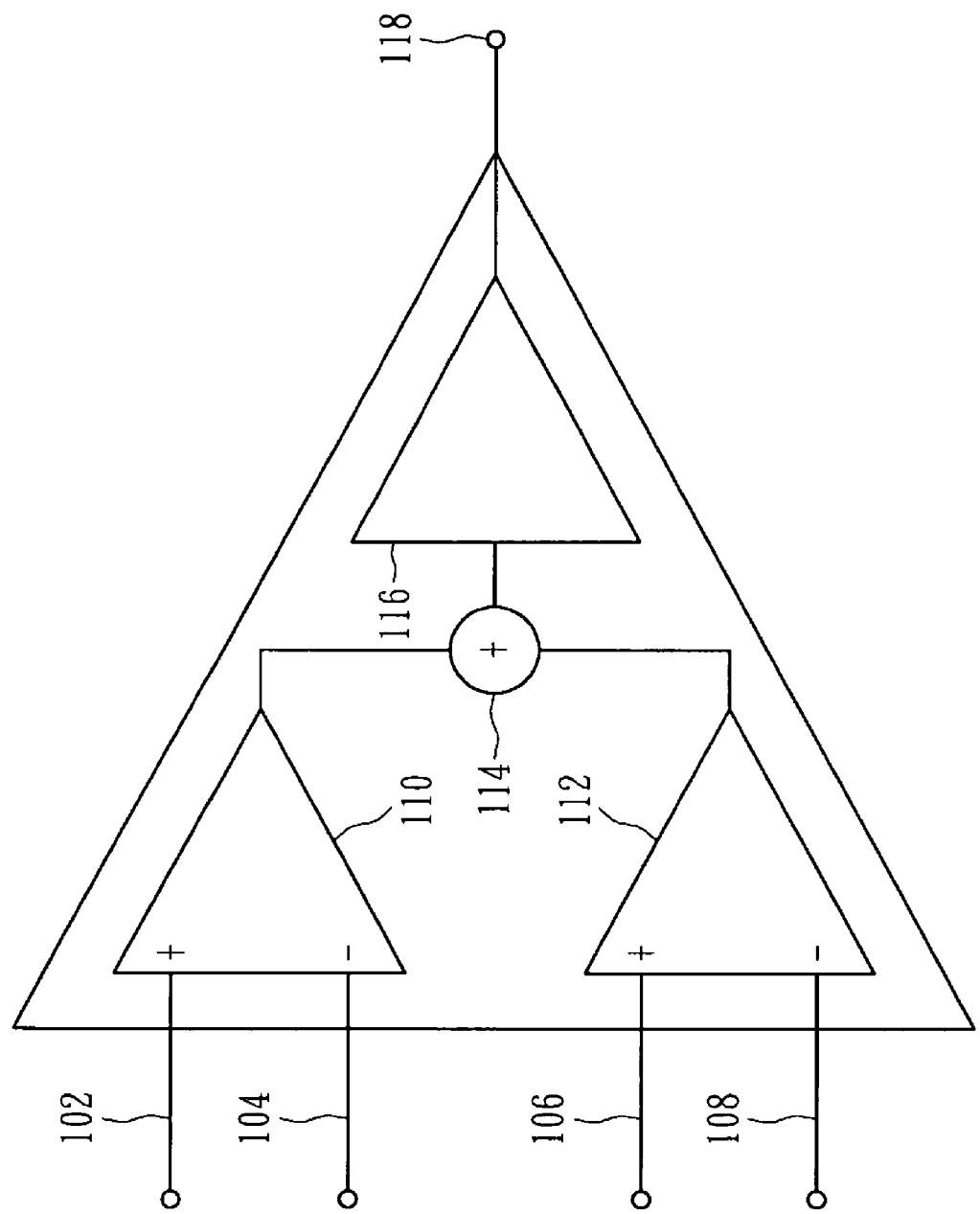
FIG. 1 shows a structural diagram of a well-known two-input operational amplifier.
Figure 2:
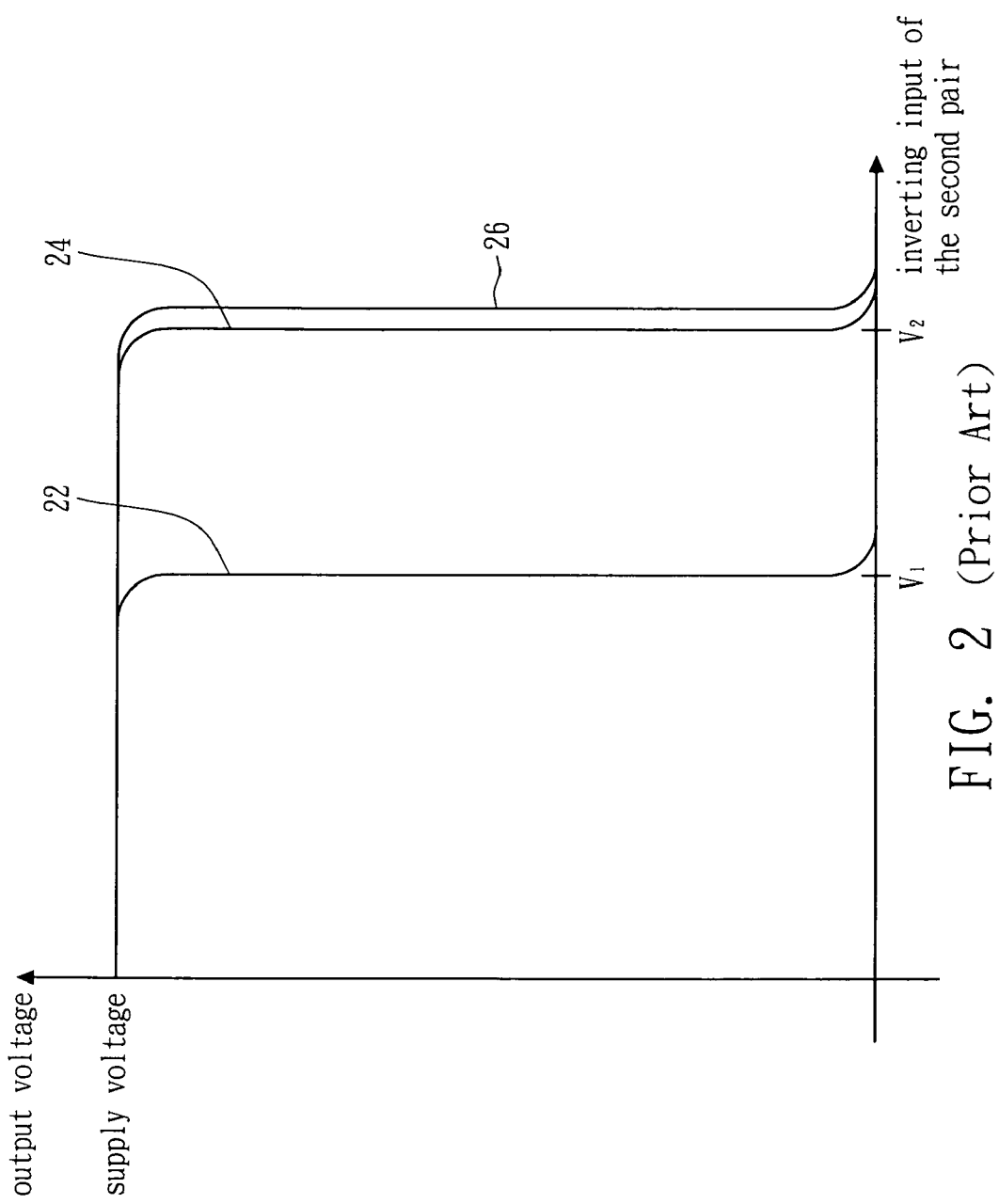
FIG. 2 shows input/output curves of a prior two-input operational amplifier.
Figure 3:
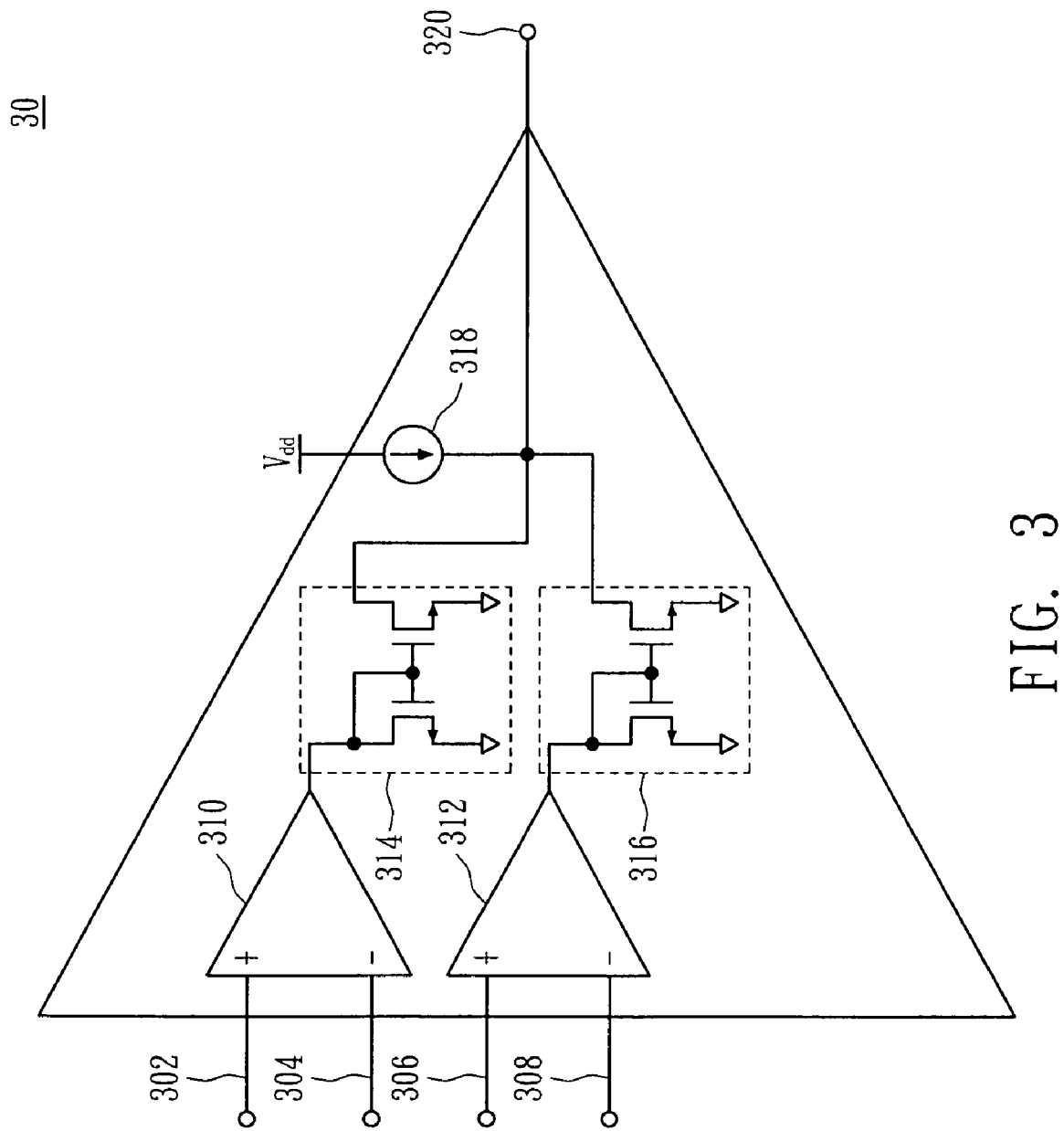
FIG. 3 shows a block diagram of the multi-input operational amplifier according to one embodiment of the present invention.

The primary purpose of the present invention is to present a novel transconductor, which prevents one pair input of a multi-input operational amplifier from being affected by other input pairs. FIG. 3 shows a block diagram of the multi-input operational amplifier 30 according to one embodiment of the present invention. The multi-input operational amplifier 30 includes two pairs of input terminals, a first transconductor 310, a second transconductor 312, two current mirrors 314 and 316, a current source 318 and an output terminal 320. The two pairs of the input ends include a first input terminal 304, a first reference voltage input terminal 302, a second input terminal 308 and a second reference voltage input terminal 306. The first input terminal 304 and the first reference voltage input terminal 302 feed into the inverting and non-inverting input terminals of the first transconductor 310, respectively. The second input terminal 308 and the second reference voltage input terminal 306 feed into the inverting and non-inverting input terminals of the second transconductor 312, respectively. The first transconductor 310 and the second transconductor 312 generate a first current and a second current based on voltage difference of their input pairs, and the first and second currents flow into the first current mirror 314 and second current mirror 316. The current source 318 generates a total current, and is coupled to the first and second current mirrors 314 and 316. The output terminal 320 is coupled to the current source 318, the first current mirror 314 and the second current mirror 316.

Figure 4A:
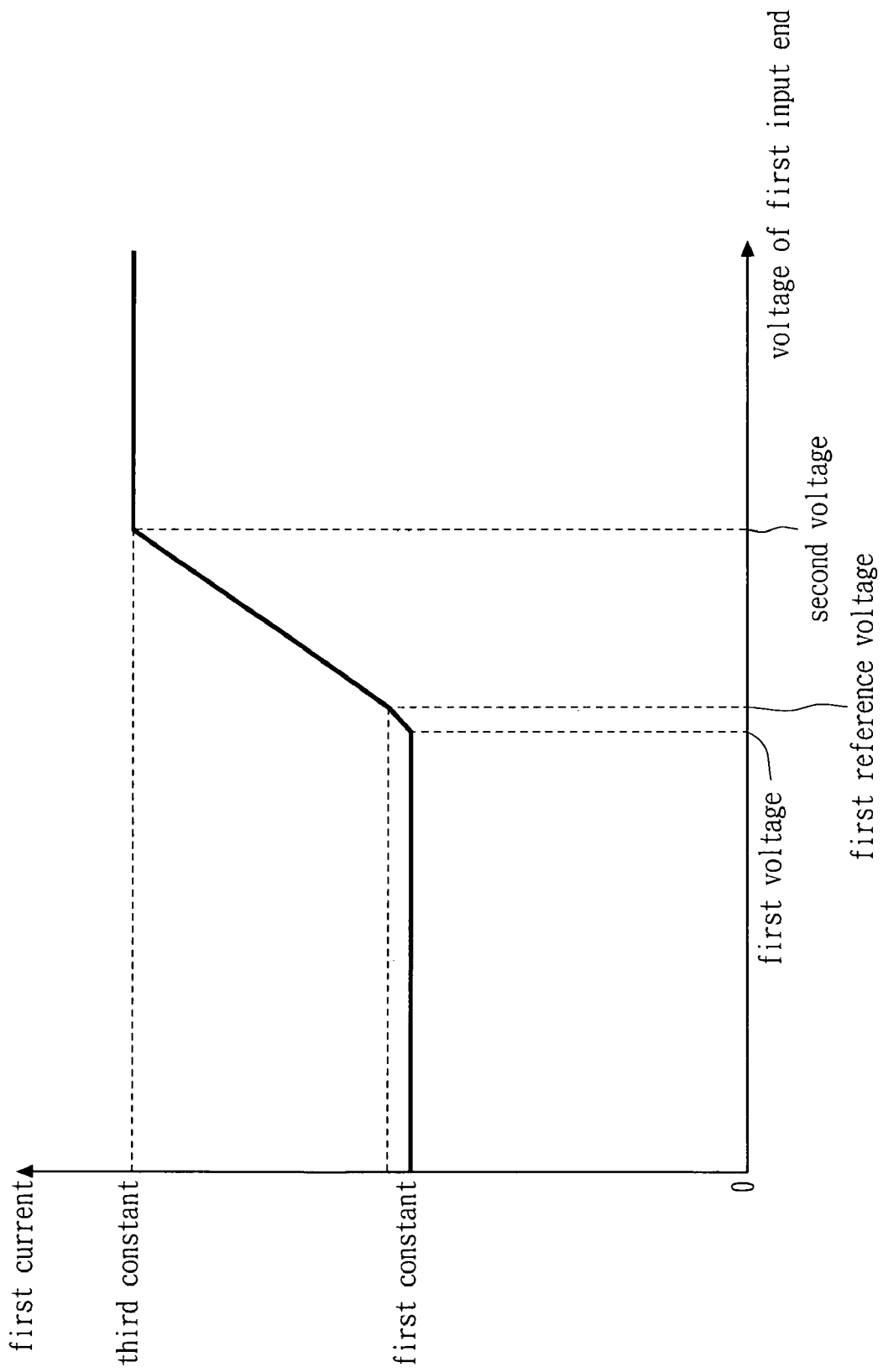
FIGS. 4A and 4B show transconductance characteristic curves of first and second transconductors.
Figure 4B:
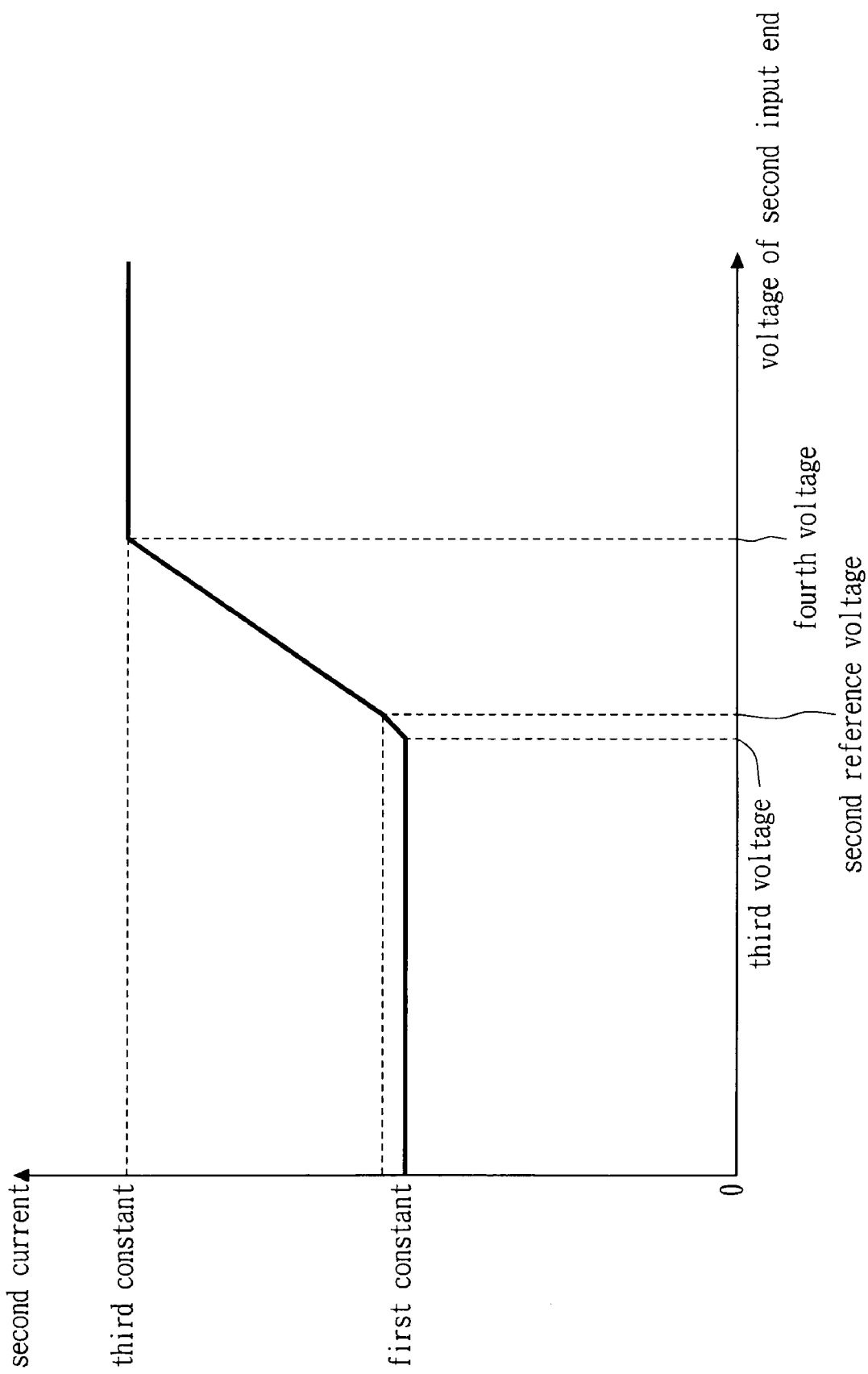
Figure 4C:
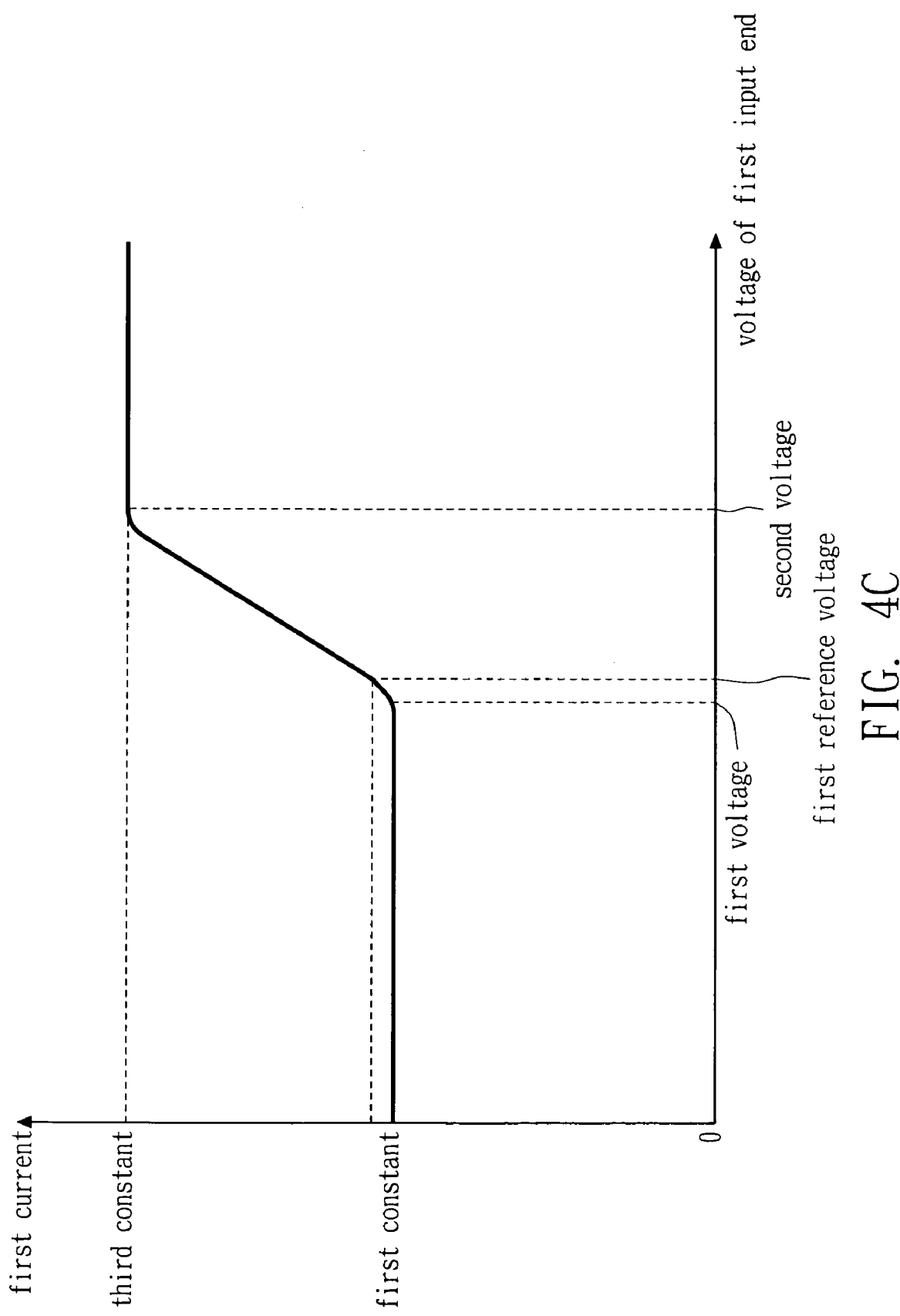
FIGS. 4C and 4D show other transconductance characteristic curves of the first transconductors.
Figure 4D:
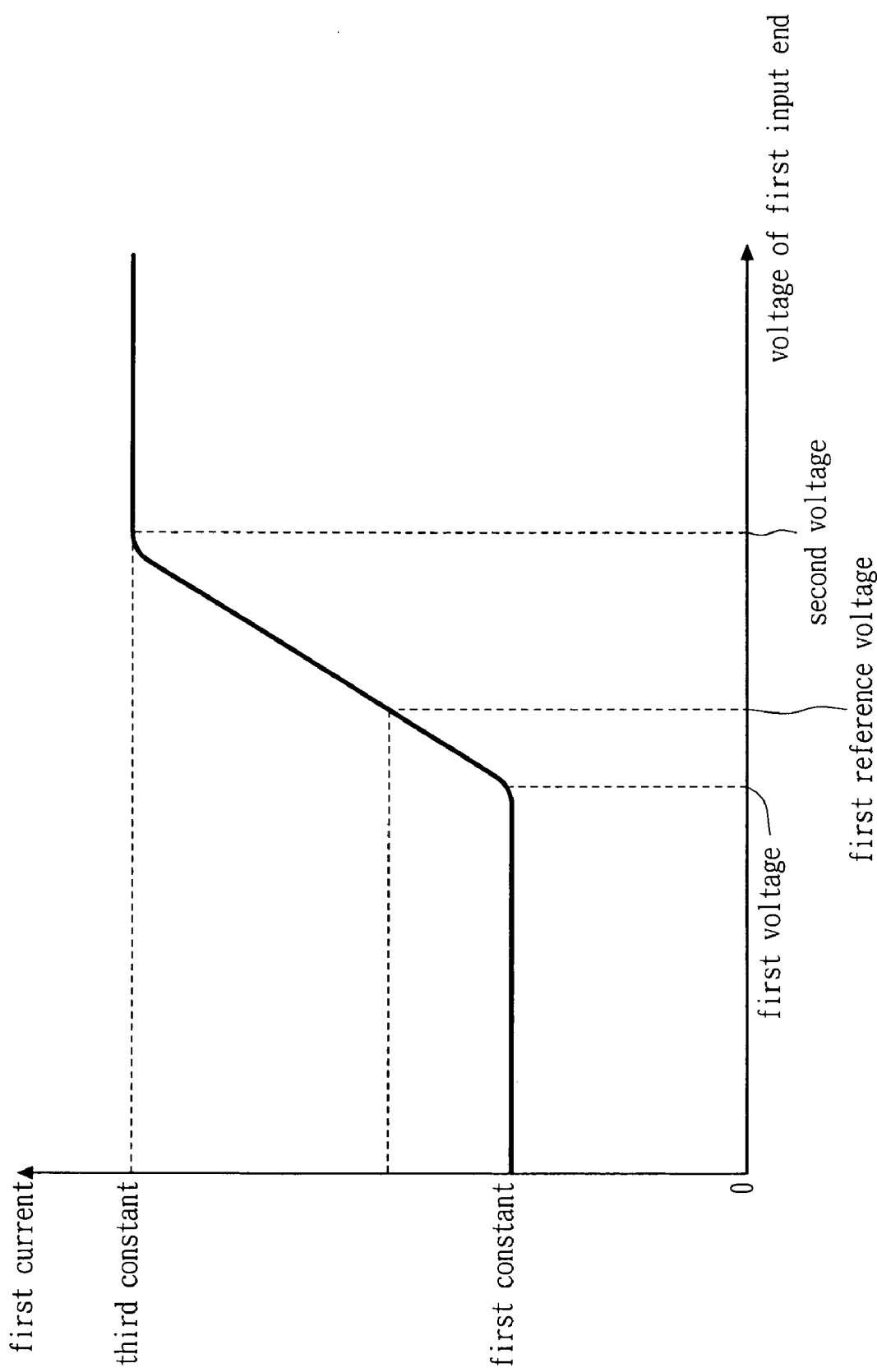

FIG. 4A shows a transconductance (voltage versus current) characteristic curve of a first transconductor 310. The curve can be separated into two phases. The first phase includes a constant first current which is unaffected by the input voltage. The other phase includes a linear relation between the magnitude of the input voltage and current. In detail, when the voltage of the first input terminal is smaller than a first voltage, the magnitude of the first current is a first constant. When the voltage of the first input terminal is greater than or equal to the first voltage and smaller than the second voltage, the magnitude of the first current positively associates the voltage of the first input terminal. When the voltage of the first input end is greater than a second voltage, the magnitude of the first current is approximately a third constant. The first constant is smaller than one half of the third constant in order to provide a buffer margin to prevent erroneous operations caused by process variation. The transconductance characteristic curve of the second transconductor 310 is similar to that of the first transconductor 312, as shown in FIG. 4B. First, the transconductance characteristic curves of the second transconductor 310 and 312 are not limited to linear variation. In other embodiments, the curve ratio of the voltage-current characteristic curve of the first transconductor 310 is a continuous function. In other words, the voltage-current characteristic curve is in smooth variation, as shown in FIG. 4C. In this embodiment, the transconductance characteristic curve of the second transconductor 312 is close to that shown in FIG. 4C, and thus the two input ends of the multi-input operational amplifier match each other to reduce input bias. In addition, the magnitude of the first voltage is adjustable and relevant to the circuit design of the first transconductors. FIG. 4D shows another transconductance characteristic curves based on different magnitude of the first voltage.

In FIG. 3, the current mirrors 314 and 316 are composed of a pair of transistors, whose gate width approximately equals gate length. Therefore, the first current flowing from the first transconductor 310 is approximately equal to the first mirror current flowing from the current source 318, and the current flowing from the second transconductor 312 is approximately equal to the second mirror current flowing from the current source 318. The output terminal 320 is coupled to the first current mirror 314, the second current mirror 316 and the current source 318.

Figure 5:
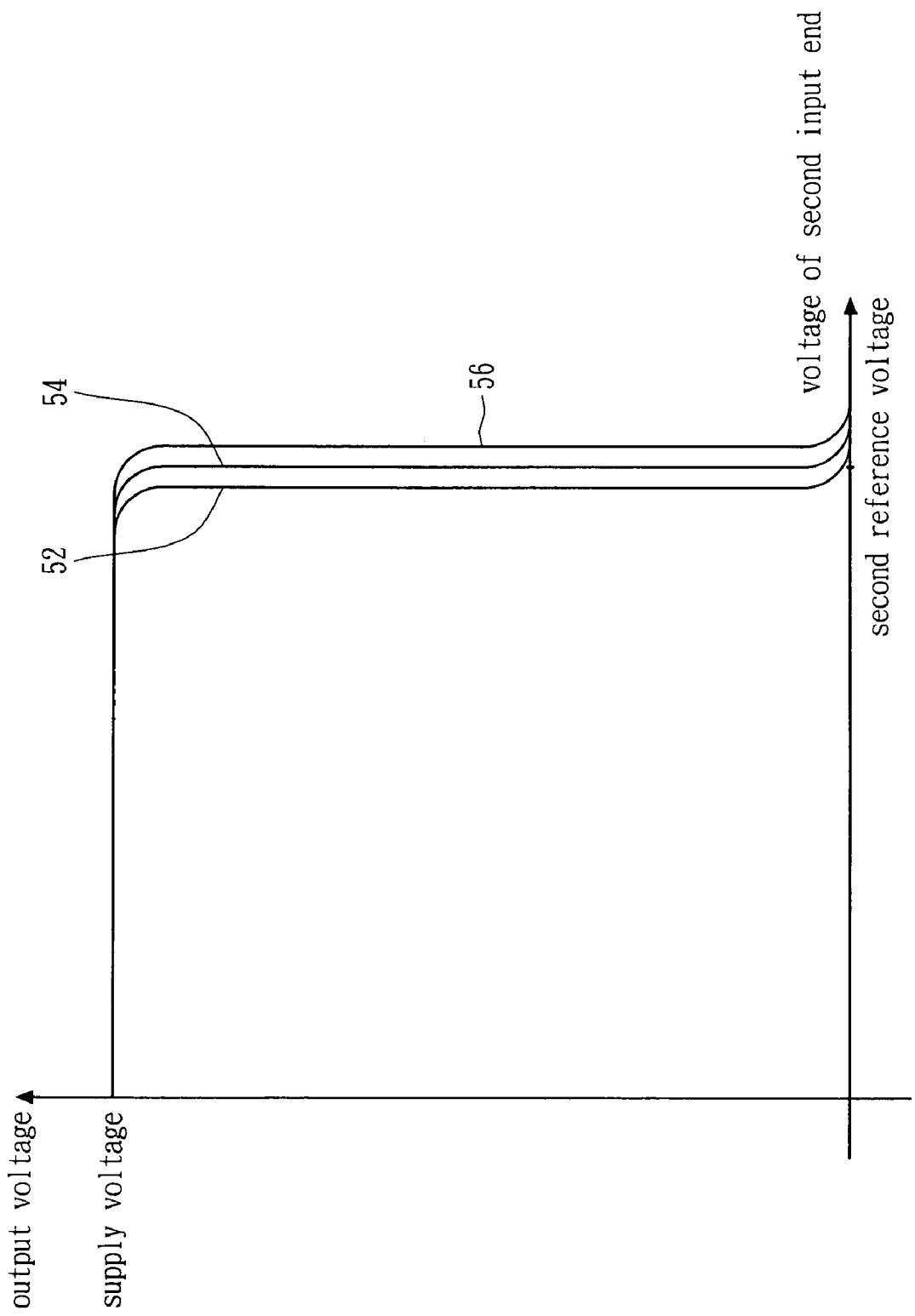
FIG. 5 shows the relation of the voltages of the second input terminal and the output terminal under different magnitudes of the first input terminal.

FIG. 5 shows the relation of the voltages of the second input terminal 308 and the output terminal 320 under different magnitudes of the first input terminal 304. The curve 52 shows a relation of the voltages of the first input terminal 308 and the output terminal 320 where the voltage of the first input terminal 304 is equal to the first reference voltage. The curves 54, 56 represent, respectively, the relation of the voltages of the second input terminal 308 and output terminal 320 where the voltage of the first input terminal 304 is slightly smaller than the first reference voltage and equal to zero voltage. In this embodiment, the differences between the curves 52, 54 and 56 are far smaller than those between curves 22, 24 and 26; this indicates that the present multi-input operational amplifier is almost irrelevant to the input offset.

The above-described embodiments of the present invention are intended to be illustrative only. Numerous alternative embodiments may be devised by persons skilled in the art without departing from the scope of the following claims.

What is claimed is:

1. A multi-input operational amplifier, comprising:
a first transconductor configured to generate a first current in accordance with a voltage of a first input end and a first reference voltage, wherein the first current is a non-zero first constant if the voltage of the first input end is smaller than a first voltage, and the first current is proportional to the voltage of the first input end if the voltage of the first input end is between the first voltage and a second voltage;
a second transconductor configured to generate a second current in accordance with a voltage of a second input end and a second reference voltage, wherein the second current is a non-zero second constant if the voltage of the second input end is smaller than a third voltage, and the second current is proportional to the voltage of the second input end if the voltage of the second input end is between the third voltage and a fourth voltage;
a first current minor configured to generate a first mirror current in accordance with the first current;
a second current minor configured to generate a second minor current in accordance with the second current; and
a current source connected to the first current mirror and the second current mirror.

2. The multi-input operational amplifier of claim 1, wherein the first current is a non-zero third constant and the non-zero first constant is smaller than one half of the non-zero third constant if the voltage of the first input end is greater than the second voltage.

3. The multi-input operational amplifier of claim 1, wherein the second current is a non-zero third constant and the second constant is smaller than one half of the non-zero third constant if the voltage of the second input end is greater than the fourth voltage.

4. The multi-input operational amplifier of claim 1, wherein the non-zero second constant is substantially equal to the non-zero first constant.

5. The multi-input operational amplifier of claim 1, wherein the curve ratio of the voltage of the first input end versus a transconductance characteristic curve of the first current is a continuous function.

6. The multi-input operational amplifier of claim 1, wherein the curve ratio of the voltage of the second input end versus a transconductance characteristic curve of the second current is a continuous function.

7. A method for reducing an input offset of a multi-input operational amplifier, the multi-input operational amplifier including a first input end, a second input end and a current source, the method comprising the steps of:
setting a first reference voltage, a second reference voltage, a first voltage, a second voltage, a third voltage and a fourth voltage;
if the voltage of the first input end is between the first voltage and the second voltage, a first current positively associating the voltage of the first input end being generated; otherwise the first current being a constant; and
if the voltage of the second input end is between the third voltage and the fourth voltage, a second current positively associating the voltage of the second input end being generated; otherwise the second current being a constant.

8. The method of claim 7, wherein the constant current is a third constant if the voltage of the first input end is greater than the second voltage, and the constant current is smaller than one half of the third constant if the voltage of the first input end is smaller than the first voltage.

9. The method of claim 7, wherein the constant current is a third constant if the voltage of the second input end is greater than the fourth voltage, and the constant current is smaller than one half of the third constant if the voltage of the second input end is smaller than the third voltage.

10. The method of claim 7, wherein in the step of generating the first current, the curve ratio of the voltage of the first input end versus a transconductance characteristic curve of the first current is a continuous function.

11. The method of claim 7, wherein in the step of generating the first current, the curve ratio of the voltage of the second input end versus a transconductance characteristic curve of the second current is a continuous function.

* * * * *